(12) United States Patent
Ceraso

(10) Patent No.: US 9,603,264 B2
(45) Date of Patent: Mar. 21, 2017

(54) METHOD AND APPARATUS FOR WELDING PRINTED CIRCUITS

(75) Inventor: Bruno Ceraso, Albizzate (IT)

(73) Assignee: CEDAL EQUIPMENT S.R.L., Milan (IT)

( * ) Notice: Subject to any disclaimer, the term of this patent is extended or adjusted under 35 U.S.C. 154(b) by 703 days.

(21) Appl. No.: 13/878,686

(22) PCT Filed: Oct. 11, 2011

(86) PCT No.: PCT/IB2011/054486
§ 371 (c)(1),
(2), (4) Date: May 16, 2013

(87) PCT Pub. No.: WO2012/052877
PCT Pub. Date: Apr. 26, 2012

(65) Prior Publication Data
US 2013/0220995 A1    Aug. 29, 2013

(30) Foreign Application Priority Data

Oct. 19, 2010    (IT) .............................. GE2010A0116

(51) Int. Cl.
*H05K 3/46*    (2006.01)

(52) U.S. Cl.
CPC ............ *H05K 3/46* (2013.01); *H05K 3/4638* (2013.01); *H05K 2203/065* (2013.01); *H05K 2203/101* (2013.01)

(58) Field of Classification Search
CPC .. H05K 3/4638; H05K 3/46; H05K 2203/101; H05K 2203/065
USPC .... 219/78.02, 536, 602, 603, 605, 633, 645; 29/879, 889.1
See application file for complete search history.

(56) References Cited

U.S. PATENT DOCUMENTS

| | | | | |
|---|---|---|---|---|
| 4,809,058 A | * | 2/1989 | Funamoto | H01L 23/473 257/697 |
| 6,509,555 B1 | * | 1/2003 | Riess | B23K 13/01 219/633 |
| 2005/0023275 A1 | * | 2/2005 | Lazaro Gallego | B32B 37/065 219/633 |
| 2007/0284034 A1 | * | 12/2007 | Fathi | B29C 65/04 156/273.9 |

FOREIGN PATENT DOCUMENTS

| | | |
|---|---|---|
| EP | 1 460 890 A1 | 9/2004 |
| WO | 2008/028005 A2 | 3/2008 |
| WO | 2009/063515 A1 | 5/2009 |

OTHER PUBLICATIONS

International Search Report, PCT/IB2011/054486, Jul. 24, 2012.

* cited by examiner

*Primary Examiner* — Thien S Tran
(74) *Attorney, Agent, or Firm* — Sughrue Mion, PLLC

(57) ABSTRACT

The invention relates to a method for bonding stacked layers (19, 20) for making printed circuits, by electromagnetic induction.
In particular, a magnetic flux is locally induced at a plurality of conducting spacers (25) provided along a peripheral area (22) of the multilayer stack (18).
By this method, it is possible to induce magnetic fluxes with opposite sign in individual areas of the peripheral area, thus achieving the maximum energy efficiency during the bonding process.
The invention further comprises an induction head and a bonding apparatus for performing the method.

6 Claims, 6 Drawing Sheets

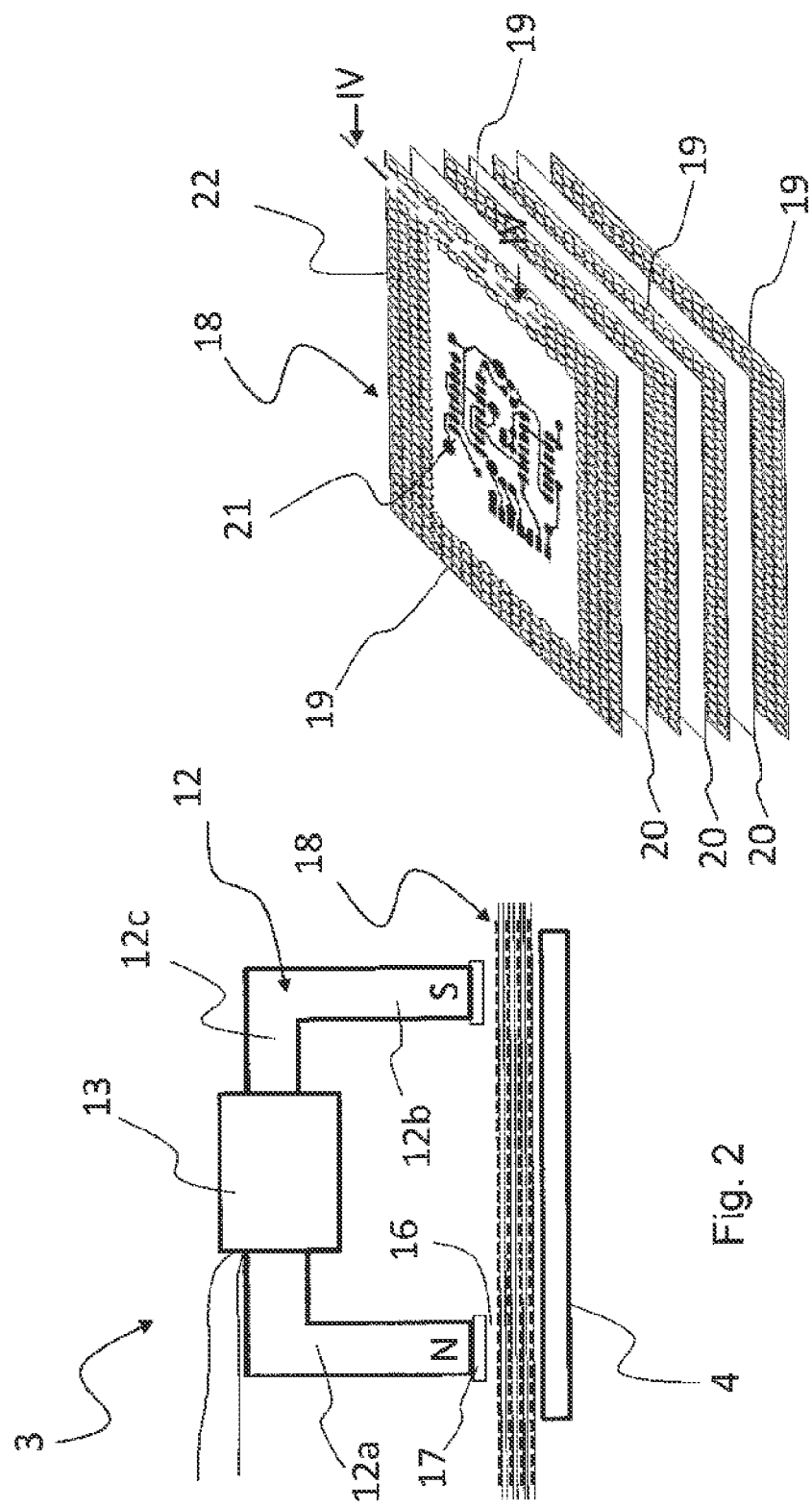

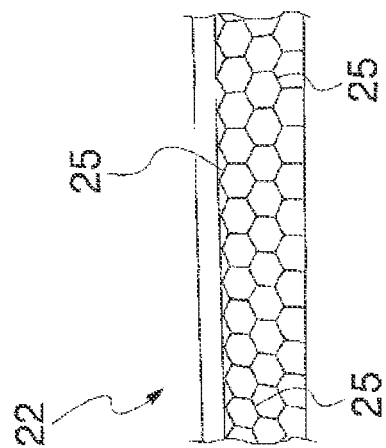
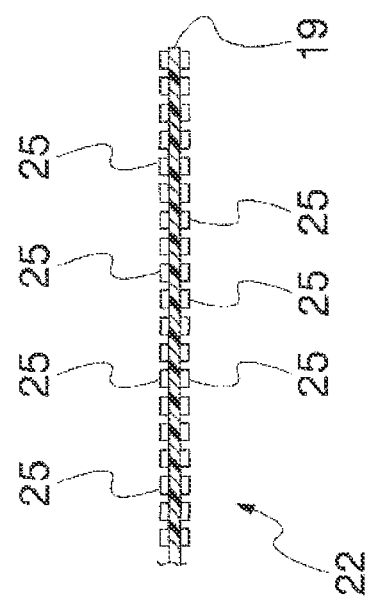

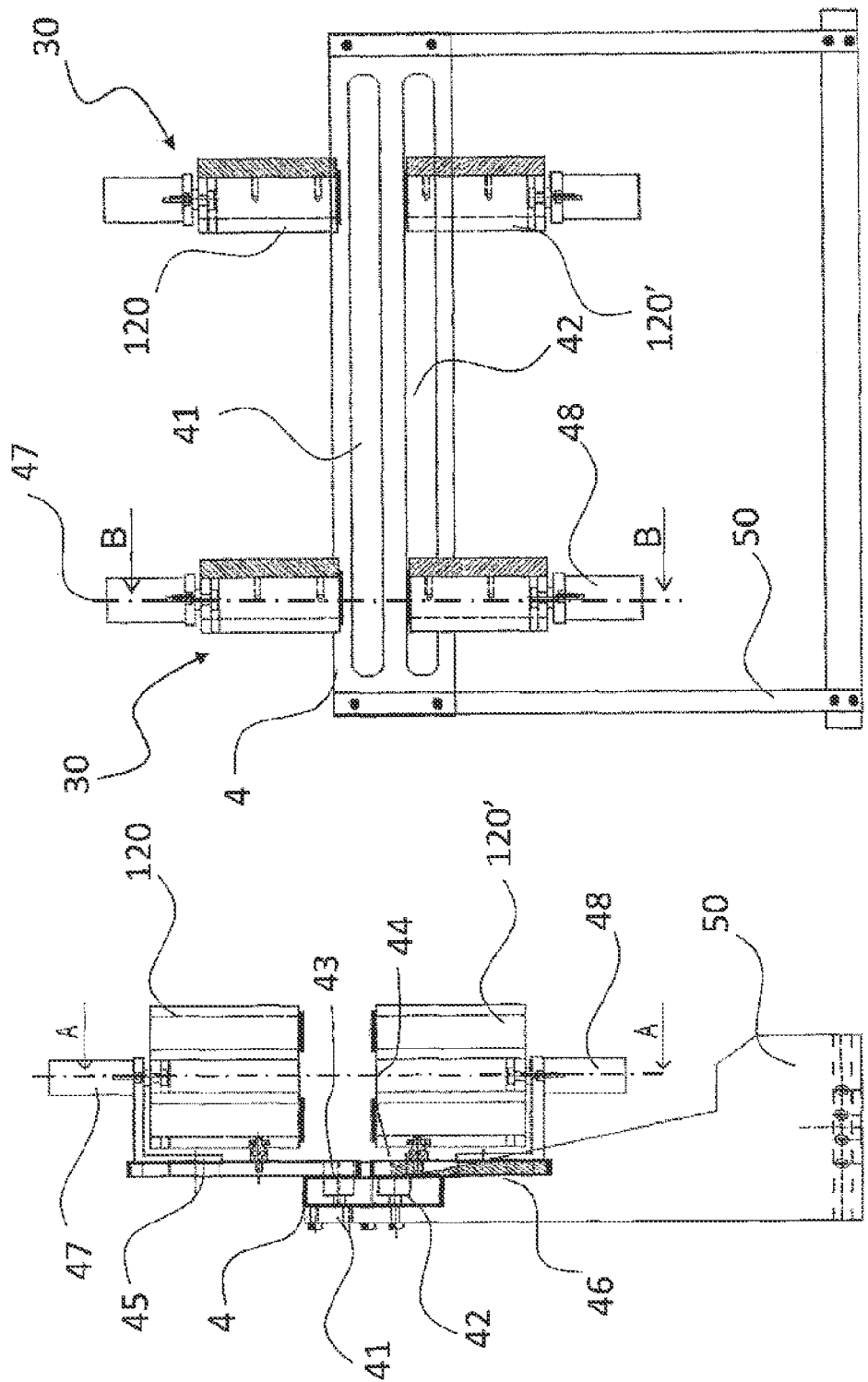

METHOD AND APPARATUS FOR WELDING PRINTED CIRCUITS

The present invention relates to a method and an apparatus for bonding stacked layers of printed circuits.

BACKGROUND OF THE INVENTION

1. Field of the Invention

Firstly, in order to better understand the invention and the description below, it is worth giving some short information about the manufacturing of printed circuits to which the present invention is preferably applied.

2. Background

As it is known, printed circuits for electronic applications such as those used for computers (e.g. Personal computers), telecommunication apparatuses (telephones, radios, etc.) household appliances and so on, are obtained by overlapping several conducting layers incorporating the traces designed according to the layout of the circuit, which are separated by layers made of electrically insulating material.

Such configuration leads to a multilayer stack that allows the final printed circuits to be obtained by means of subsequent processing and finishing steps; the circuits can be of the rigid type, such as for example electronic cards (so called PCBs or printed circuit boards), or flexible type such as circuits used for small apparatuses or associated to moving parts of machines.

The several overlapped layers of the stack are closely joined together by means of an adhesive applied on an electrically insulating substrate; generally the latter is of textile or fibre type, made of glass, synthetic fibre or the like and it is impregnated with the adhesive such that it is usually called a pre-preg (the abbreviation for pre-impregnated).

Layers are usually joined and glued into suitable presses where the semifinished multilayer stack is subjected to a heating and compression cycle.

In order to obtain the final desired product, that is a printed circuit having the designed functional and structural properties, it is necessary to accurately overlap the conducting and insulating layers in the multilayer stack.

Therefore, to this end, the relative movements between a layer and the other one have to be prevented during the several steps for processing of the multilayer stack.

To this end, it is known to provide a spot welding of the stacked layers, such to keep them firm and therefore such to allow the multilayer stack to be handled: the present invention relates to such background.

The present invention relates to a new method and to a relevant apparatus for bonding at predetermined locations the layers of electronic circuits overlapped as a stack.

During the last decades several bonding techniques have been developed with more or less satisfactory results, based on the localized heating of the multilayer stack; for example apparatuses have been manufactured wherein the necessary thermal power is supplied by electrodes heated by heating elements or wherein radiant energy is used in the form of microwaves or electromagnetic induction.

For example, a method and an apparatus for performing it are known from the American patent U.S. Pat. No. 7,009,157 B2 to Lazaro Gallego, wherein the multilayer stack of printed circuits is bonded at predetermined locations.

The latter are arranged at the corners of the several overlapped layers and short-circuited turns are placed at the region thereof: induced currents are generated in the turns by applying a magnetic induction field thereto, which produce the heat necessary to locally melt the thermosetting resin that impregnates the insulating substrates (the pre-preg).

The locally hardened resin guarantees the layers to be joined at the locations where short-circuited turns are provided, such to achieve the desired solid configuration of the multilayer stack.

In order to apply the magnetic induction to the turns, the patent U.S. Pat. No. 7,009,157 provides an apparatus with induction heads which comprise a substantially "C" shaped core upon which a coil is wound, and two telescopic pole pieces: the multilayer stack is interposed between the pole pieces whose mutual distance can be adjusted such that they slightly press against the multilayer stack, so that a good contact and a better application of the magnetic induction field is guaranteed.

Although this type of heating is able to reach efficaciously even the inner areas of the multilayer stack, it has, however, some considerable drawbacks.

Firstly, it allows the multilayer stack to be bonded only at individual restricted locations, namely those where short-circuited turns are placed.

Consequently, the bonding process is not so much flexible since if the shape of the multilayer stack and/or the position of the short-circuited turns change, it is necessary to adjust the position of the induction heads.

Therefore, the magnetic configuration thereof changes as the thickness of the multilayer stack changes, since it is necessary to translate the pole pieces in order to adjust their mutual distance: therefore the flux intensity consequently changes (all the other conditions being equal) when multilayer stacks with different thicknesses have to be processed.

Similar remarks are also valid in relation to another induction bonding apparatus known in the patent application US 2010/0212945 A1 to Faraci, which describes a bonding machine wherein induction heads are composed of "E" shaped cores separated from each other.

This shape of the magnetic cores involves a flux passing through the central leg upon which the excitation coil is wound, different than the side legs that convey a respective flux that is about one half of that of the central leg.

The fact that it is necessary to bond the multilayer stacks at the shorted-circuit turns, affects the flux linked to the turns that essentially is given by the vector sum of that flowing through the central leg and those associated to the side legs of the core.

Accordingly the flux effectively linked to the turn is lower than that generated by the induction coil on the central leg, with a waste of energy greater due to an unbalanced distribution of the fluxes.

This type of solution may further results in a non optimal magnetic flux for quickly bonding a thick multilayer stack, since the magnetic flux is not homogeneously distributed among the layers of the multilayer stack causing them not to be uniformly bonded, due to the different temperatures reached in the several layers during the bonding phase.

Therefore the technical problem of the present invention is to overcome the above mentioned drawbacks of the known bonding systems.

SUMMARY OF THE INVENTION

The idea for solving such problem is to bond the stacked layers of the printed circuits by means of induction, at a plurality of individual locations; the bonding at the individual locations is preferably made simultaneously by means of opposite magnetic cores such to obtain a uniform magnetic flux in the bonding locations, flowing through the stack of stacked layers without losses.

The characteristics of the bonding method according to the invention are stated in the claims annexed to this description; the invention further comprises an apparatus for performing the method whose characteristics are also stated in the claims below.

BRIEF DESCRIPTION OF THE DRAWINGS

These characteristics and the effects deriving therefrom, in addition to the advantages achieved by the present invention, will be more clear from the description of one embodiment thereof shown in the annexed drawings, provided only by way of example and not as a limitation, wherein:

FIG. 2 is a detailed schematic view of an induction bonding head according to the present invention;

FIG. 3 is an exploded view of a multilayer stack for making printed circuits according to the invention;

FIG. 4 is a sectional view taken along the line IV-IV of FIG. 3;

FIG. 5 is a detail of a layer for printed circuits according to the invention;

FIG. 7 is a side view of a detail of the induction bonding apparatus of FIG. 1;

FIG. 8 is a sectional view taken along the line A-A of FIG. 7;

DETAILED DESCRIPTION OF THE INVENTION

Figure 1:
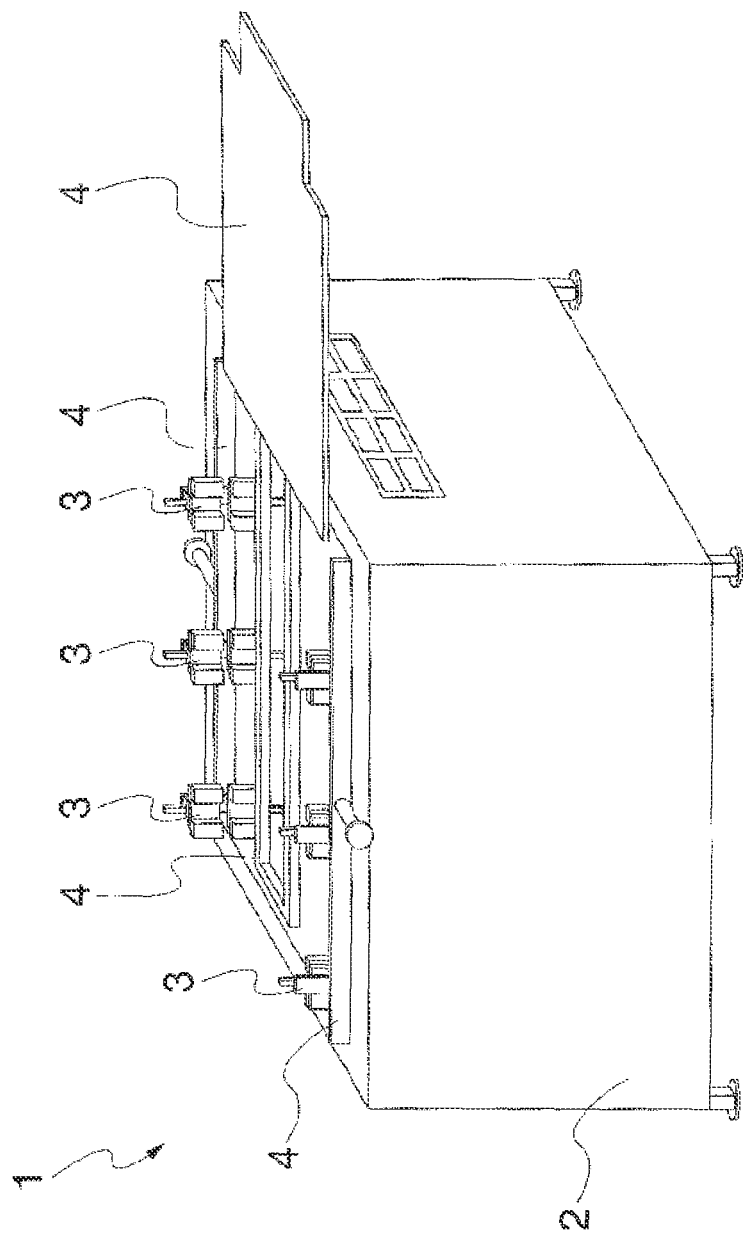
FIG. 1 is a general perspective view of a bonding apparatus according to the invention.

With reference to the above listed figures, the first one generally shows an apparatus 1 according to the invention, which comprises an outer casing 2 housing a plurality of induction bonding heads 3 arranged along the opposite sides of the casing.

Induction heads 3 slide along guides 4, in order to be placed at the locations to be bonded, and the rows of heads 3 arranged at the two sides of the casing 2 are spaced apart such that a table 5 can be inserted therebetween for supporting the layers of the printed circuits, which will be better described below.

The table 5 is substantially rectangularly shaped and is tiltable with respect to a front side; it can further be moved to and fro between the bonding heads 3 in a manner known per sè, in order to move the layers of the printed circuits during the several processing steps.

The bonding heads 3 are equal to each other and therefore only one of them will be described below, but what will be disclosed shall be intended also for the other ones. With reference to FIG. 2, the induction head 3 shown therein comprises a first induction core 12 upon which an excitation inductor or coil 13 is wound, and a second induction core 14.

The two induction cores 12 and 14 are made of a material permeable to a linked magnetic flux generated by the inductor 13, when the latter is excited by an alternating current having a frequency in the range of several kHz, preferably ranging from 18 kHz to 30 kHz, and in this specific instance equal to about 24 kHz.

The magnetic flux permeable material of the induction devices preferably is ferrite: the use of the ferrite can reduce eddy currents generated by the variable magnetic flux, without the need of laminating the induction cores 12 and 14.

If a ferromagnetic material (eg. Soft iron) is used, such eddy currents would overheat too much the cores 12 and 14, unless they are subjected to a lamination process; ferrite has a high electrical resistivity thus reducing the thermal power dissipated by the induction cores 12 and 14 due to eddy currents, when a variable magnetic flux passes through them.

The first induction core 12 preferably has a reversed "C" shape, and it comprises a pair of parallel arms 12a, 12b extending from a central body 12c; the latter is wound by the inductor 13 composed of a coil having a relatively small amount N of turns, ranging from 20 to 35 and preferably 30, which is made of a conducting material (e.g. copper or alloys thereof), with a circular section with a diameter suitable for the specific application.

The more the necessary power is, the greater the section of the conducting element and of the induction core 12 shall be; therefore it has to be pointed out that depending on the amount of turns and of the type of bonding head, as it will be better described below, the supply current changes from 10 to 14 Ampere with a voltage ranging from 300 to 560 Volt.

The free ends of the two arms 12a, 12b of the induction core have opposite polarities such that the magnetic flux generated by the inductor 13 develops along a magnetic circuit extending from the first induction core 12 to the second induction core 14, passing through the air gap 16 provided therebetween and wherein the stack 18 of layers of the printed circuits to be bonded is placed.

In this example the second induction core 14 is composed of a bar or plate made of the same material (ferrite) as the first one; the thickness of the plate and its dimensions are proportionate to the magnetic flux flowing in the circuit. However, the surface of the plate 14 has to be preferably greater than the plan projection thereupon of the first core 12 opposite thereto, such to minimize the magnetic flux losses.

Moreover, the area of the cross-section of the second core 14 has to be equal to or greater than that of the first core 12 such to facilitate the passage of the magnetic flux, as it will be better described below.

Then, in order to protect the bonding poles against the contact with the thermosetting resin impregnating the insulating layers (the pre-preg), plates 17 made of a suitable material (eg. Teflon, anodized aluminum or the like) known per sè are provided in this example.

According to the invention, the stack 18 of overlapped layers to be bonded comprises conducting layers 19 alternated to insulating layers 20; the former have the layout of the printed circuit to be made, while the latter are the above mentioned pre-preg.

Moreover, the conducting layers 19 have a peripheral area 22 wherein conducting spacers 25 are arranged; these are members made of conducting material (e.g. copper) having a thickness substantially equal to that of the printed circuit 21, therefore it changes from some tenths of millimeters to some millimeters depending on applications.

Spacers 25 have a circular, elliptical or polygonal (quadrilateral, hexagonal etc.) shape, and are regularly quincuncially arranged; they have a surface that can change from 3 to 30 mm², and are equally spaced apart from each other at a distance preferably in the range of 1-2 millimeters.

Thus, it is possible to have a clear area or zone 22 along the edge of the conducting layers 19, composed of a plurality of evenly arranged members: the width of this zone changes from 4-5 centimeters to 1 centimeter or even less.

It has to be noted that in the layers 19, 20 of the stack 18, there are no shorted-circuit turns or other similar members arranged in predetermined locations, that on the contrary are provided in the prior art multilayer stacks: therefore the bonding heads 3 can be arranged in any locations along the sides of the multilayer stack 18 for performing the bonding, that takes place as it follows.

The plurality of sheets 19, 20 constituting the multilayer stack 18 are placed on the supporting table 5, accurately piled up by the help of suitable centering studs or abutments according to what already known in these type of applications.

The table 5 with the multilayer stack 18 made in this manner is advanced within the casing 2 of the apparatus 1, such to be placed between the bonding heads 3: they can be placed in any location with respect to the multilayer stack 18, since according to the method of the invention the bonding can be accomplished in every region of the clear zone 22.

Therefore, the heads 3 can be arranged in any location of the guides 4, depending on the shape and dimensions of the layers 9, 10 to be bonded; however, it can be understood that generally it will be preferable to have a uniform distribution of the bonding locations along the sides of the stack 18, such to achieve a safer attachment and a more stable configuration.

Consequently, the bonding heads 3 will be generally evenly spaced apart one to the other.

In this instance, it has to be noted that at the beginning of each bonding cycle the induction cores 12 and 14 are in the open condition such to allow the multilayer stack 18 to be introduced therebetween, whose thickness can change from time to time; however, the distance between the cores is adjusted, as it will be described better below, such to bring them in contact with the upper and lower faces respectively of the multilayer stack 18.

In this operating condition, it is possible to power the inductor 3 for generating a magnetic field in the first core 12, which develops along the magnetic circuit comprising the second induction core 14 and the air space 16 wherein the multilayer stack 8 is introduced.

As a consequence, the magnetic flux coming from one of the poles 12a, 12b of the first core 12 enters completely in the other pole of the same core, and vice versa, passing along the plate 14 without losses: therefore the thickness of the multilayer stack 18 to be bonded is equally passed through by the magnetic flux at two separate locations, since due to the structure of the bonding head 3 the magnetic flux passing into one of the poles of the induction core 2 is the same as that passing in the other pole.

Therefore, the alternating current power of the inductor allows north (N) and south (S) magnetic polarities of the induction core 2 to be reversed, such that in the full operating condition the system reaches an optimal balance condition.

Under such condition, in the spacers 25 passed through by the high frequency alternating magnetic flux that powers the inductor 13 (from 18 to 30 kHz), eddy currents are generated, which lead to a local heating of the conducting layers 19 such that the resin that impregnates the insulating layers 20 can polymerize, by achieving the desired bonding.

Here it has to be pointed out the relevance of having a plurality of individual members such as the spacers 25, which are passed through by the same magnetic flux and in a simultaneous manner, since the flux is generated by the same coil 13.

The induced magnetic field wherein members 25 are embedded therefore is a concordant one, that is positive or negative depending on the cycles of the alternating current flowing into the inductor 13; moreover, the spacing members 25 have small dimensions with respect to the section of the induction cores 12 and 14, which is on average from 10 to 20 times smaller, thus the field passing there through is substantially constant for each of them.

Moreover, it has to be pointed out how the whole magnetic flux generated into the cores 12 and 14 passes through the multilayer stack 18, since it is all linked thereto; namely the vector sum of the field passing through the multilayer stack 18 is equal to zero.

Thus the efficiency of the induction head 3 is improved, since it is possible to bond contemporaneously the stack 18 at two different locations, at the two arms 12a, 12b of the magnetic core 12.

This effect is also possible due to the intensity of the magnetic flux that is equal (even if with the opposite sign) at the bonding locations, since the system has a symmetric geometry.

This allows both the bonding locations to have the same operating conditions (temperature, induced currents, etc.), since the magnetic field is the same: therefore it is possible to control the bonding process, which on the contrary is not possible with prior art induction heads, which are able to bond only at a single point.

Then one has not to ignore the fact that by using induction cores 12 and 14, the configuration of the system does not change as the thickness of the multilayer stack changes.

In the bonding heads 3, the pole pieces of the first induction cores are composed of side arms 12a, 12b, that are fixed: therefore even if the thickness of the multilayer stack 18 increases, the magnetic field in the first and in the second core does not change since their configuration does not change.

From the above it can be understood how the invention solves the technical problem on which it is based.

The process is able to perform the bonding at any location along the edge of the stack, where conducting spacers 25 are provided; therefore the process is flexible, since it is no more necessary to perform the bonding in the individual predetermined locations where short circuit turns are provided, as it occurs in the state of the art.

Therefore, in the same bonding apparatus 1 it is possible to easily successively process printed circuits having different shapes and dimensions without changing all the configuration of the apparatus, since heads 3 can anyway work at any location of the edge of the multilayer stack.

Moreover, the efficiency of the bonding heads 3 is optimized since all the generated magnetic flux is used for the bonding at two locations (not only one), such that with the applied power being equal the bonding is performed in twice a number of locations with respect to currently known apparatuses.

Here it has to be noted that following performed tests it has be found that the energy efficiency of the bonding heads 3 improves if the lines of the magnetic flux associated to the arms 12a, 12b are as much as possible parallel one to the other, in order to avoid interferences between fields generated by the poles of the first core 12. It has to be further noted that at the ends of the arms 12a, 12b a flux with an opposite sign will be provided, that is with a phase displacement of 180°, since it is generated by the same inductor 13: therefore it is necessary for the central arm 12*c* to have a length suitable for the type of application, namely the density and amount of the magnetic flux, in addition to the power supply frequency of the inductor 13 employed for the bonding operation have to be considered.

In order to satisfy the design requirements, the person skilled in the art will suitably design the induction core 12.

Obviously changes to the invention are possible with respect to the example described up to now.

In the following descriptions of the alternative embodiments, the parts not in common with the main embodiment will be basically described, while the same numbers with the addition of a zero will denote the parts having a similar function as those already described, therefore no further reference is made thereto.

Figure 6:
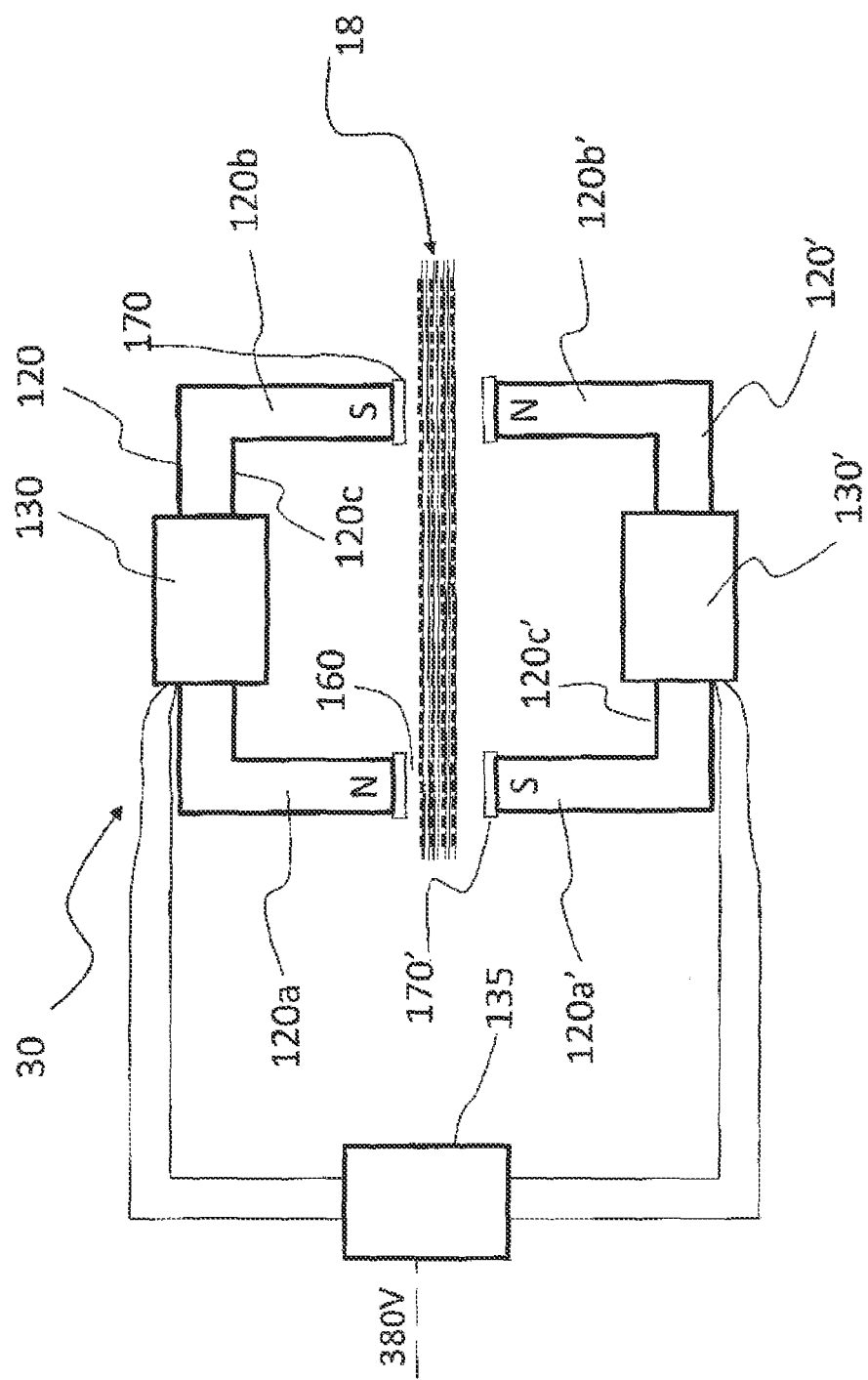
FIG. 6 is a schematic detailed view of a second embodiment of an induction bonding head according to the invention.
Figure 10:
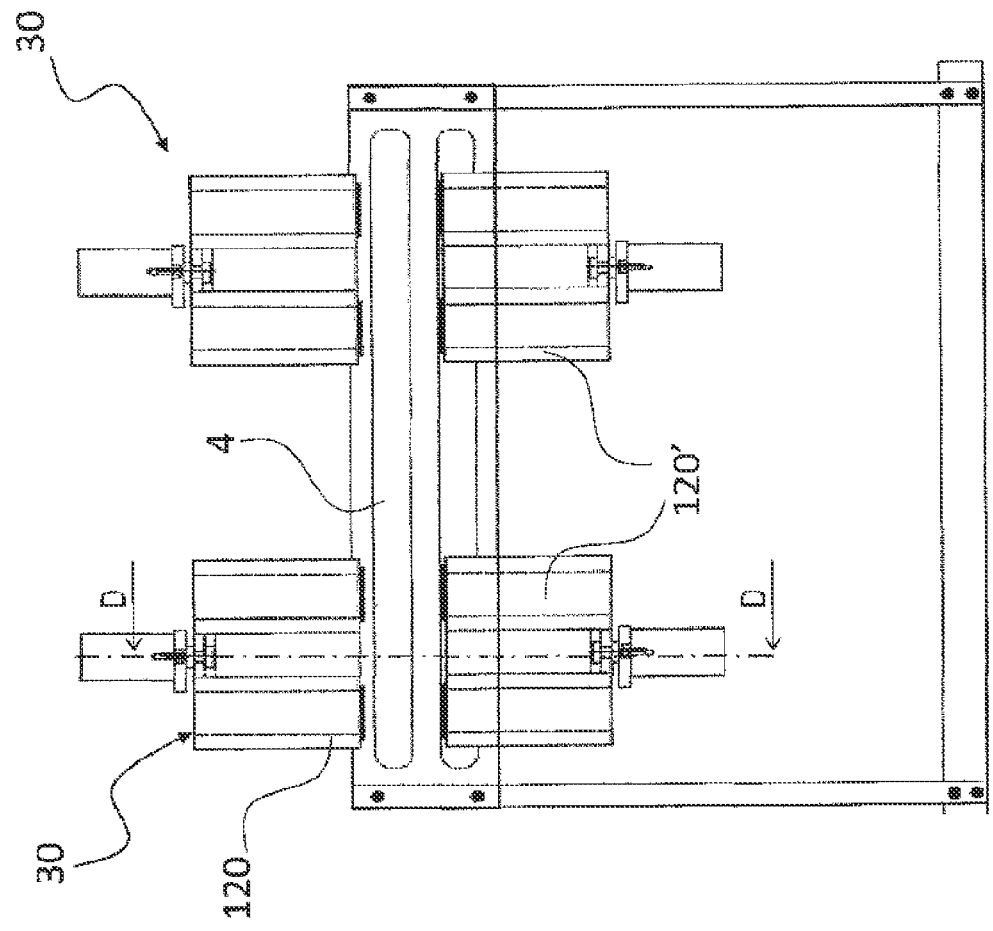
FIG. 10 is a sectional view taken along the line C-C of FIG. 9.
Figure 9:
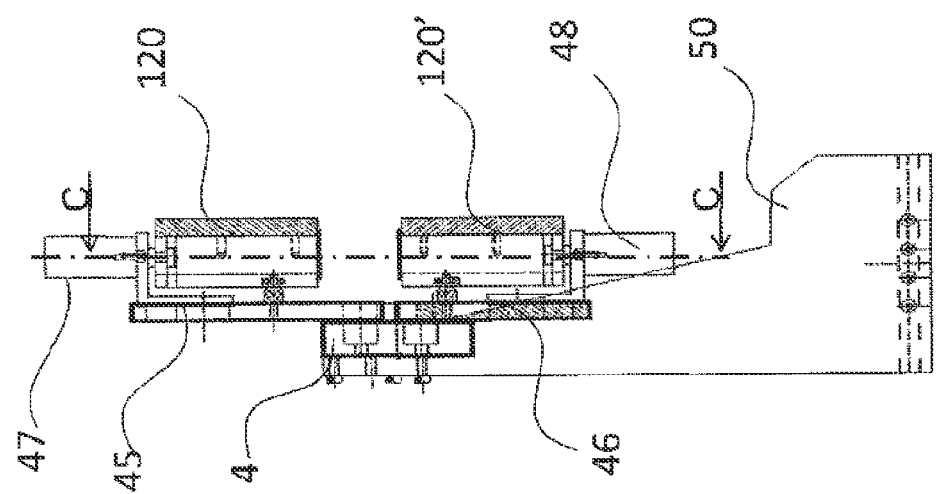
FIG. 9 is a side view of a variant of the induction bonding apparatus of FIG. 7.

A first variant shown in FIG. 6 relates to an induction head 30, which comprises two induction cores 120 and 120' equal to that of the previous example denoted by 12, upon which respective inductors 130, 130' are applied.

The induction cores 120, 120' are opposite to one another, and the multilayer stack 18 to be bonded is in the air gap 160 separating them: thus the magnetic flux that in the previous embodiment of the invention developed in the circuit composed of the two induction cores 12 and 14 wherein the second was the passive one, now develops in the two cores 120, 120' associated to a respective inductor 130, 130'.

Obviously, in order to reproduce the operation of the previous example, it is necessary for the magnetic flux in the two cores 120, 120' to be synchronized, such to close the magnetic circuit wherein the multilayer stack 18 is introduced.

To this end the inductors 130, 130' are powered with an alternating current in the frequency range from 18 to 30 kHz and preferably 24 kHz, by means of a same device 135 (so called driver) connected to the power mains (380 V phase).

The currents flowing into the two inductors 130, 130' particularly have a phase displacement one with respect to the other such that the polarities at the ends of the arms 120*a*, 120*b* of the first core 120 are reversed with respect to those of the arms 120*a'*, 120*b'* of the second core 120'.

The bonding of the multilayer stack 18 occurs at the conducting spacers 25 as described above with reference to the first example, with the same advantageous effects already explained to which the reader should refer for the sake of brevity.

Here, however, it has to point out that the energy conveyed to the overlapped layers 19, 20 in the stack 18 is about twice if compared to that of the first embodiment, such that such variant of the invention is suitable for being advantageously applied for thick multilayer stacks 18, wherein the innermost layers can be efficaciously reached. As regards the examples described up to now, however, further variants are possible, as can be more easily understood with reference to FIGS. 7 to 10 that show in detail some details of the apparatus of FIG. 1.

The guides 4, along which the bonding heads 3, 30 are arranged, are supported by vertical rods 50 provided in the casing 2 of the apparatus; within the guides 4 two parallel grooves 41, 42 are provided, rolling bearings 43, 44 associated to brackets 45, 46 supporting the bonding heads 30, 30' engaging therein.

By moving the brackets 45, 46 along the grooves 41, 42, the corresponding bonding heads 3, 30 are moved in the desired position, where they can be stopped by means of stop members, known per sè, which are not shown in the figures.

In order to adjust the distance between the induction cores 120, 120' depending on the thickness of the multilayer stack to be bonded, electromechanical actuators 47, 48 are arranged on the brackets 45, 46, which allow the above mentioned cores to be moved to and fro along a vertical direction.

It has to be further noted how in the pairs of FIGS. 7, 8 and 9, 10 the opposite induction cores 120, 120' are rotated by 90° such to be oriented parallelly to the guide 4 or transversally thereto: this allows the multilayer stack to be bonded along its edge or even inside it, further increasing the flexibility and the operating ability of the bonding apparatus according to the invention.

However, all these variants fall within the scope of the following claims.

The invention claimed is:

1. A method for induction bonding of a printed circuit multilayer stack (18), wherein the stack comprises a plurality of conducting layers (19) incorporating the printed circuit layout (21), the conducting layers respectively being separated from each other by a plurality of insulating layers (20) made of dielectric material impregnated with resin, a plurality of spacers (25) being arranged continually along the edges of the conducting layers (19) in order to keep the conducting layers spaced apart along the edges, wherein the method comprises the following steps:

inducing a magnetic flux at predetermined locations of the multilayer stack (18) with an induction head (3) comprising a C-shape inductor core (12) of magnetically permeable material in order to achieve the localized heating of the resin, wherein the inducing step comprises inducing the magnetic flux in a multitude of the plurality of spacers (25) simultaneously to simultaneously bond the multitude of spacers to the adjacent conducting layers, and wherein the C-shaped core (12) of the induction head (3) comprises magnetic poles of opposed magnetic polarity oriented towards the bonding area, so that a magnetic flux with opposite signs is induced by the induction head at a plurality of locations of the multilayer stack (18) to achieve the simultaneous bonding.

2. The bonding method according to claim 1, wherein the spacers (25) comprise a plurality of conducting elements equally spaced from each other.

3. The bonding method according to claim 1, wherein the magnetic flux with opposite sign is induced simultaneously by the same inductor (13; 130, 130').

4. The bonding method according to claim 1, wherein each induced flux is of the variable type with a frequency ranging from 18 kHz to 30 kHz, preferably equal to about 24 kHz.

5. The bonding method according to claim 2, wherein the conducting elements (25) have a circular or polygonal shape.

6. The bonding method according to claim 5, wherein the conducting elements (25) have a diameter ranging from 1 mm to 7 mm.

* * * * *